(12) United States Patent
Tsironis (10) Patent No.: US 12,379,405 B1
(45) Date of Patent: Aug. 5, 2025

(54) LOAD PULL TUNING PROBE WITH ADJUSTABLE NOTCH

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 235 days.

(21) Appl. No.: 18/221,094

(22) Filed: Jul. 12, 2023

(51) Int. Cl.
| | |
|---|---|
| *G01R 27/32* | (2006.01) |
| *G01R 27/28* | (2006.01) |
| *G01R 35/00* | (2006.01) |
| *H01P 5/04* | (2006.01) |
| *H03H 7/38* | (2006.01) |
| *H03H 7/40* | (2006.01) |

(52) U.S. Cl.
CPC ............. *G01R 27/32* (2013.01); *G01R 27/28* (2013.01); *G01R 35/005* (2013.01); *H01P 5/04* (2013.01); *H03H 7/38* (2013.01); *H03H 7/40* (2013.01)

(58) Field of Classification Search
CPC ...... G01R 35/005; G01R 27/32; G01R 27/28; H01P 5/04; H03H 7/38; H03H 7/40
See application file for complete search history.

(56) References Cited

U.S. PATENT DOCUMENTS

| | | | |
|---|---|---|---|
| 6,850,076 B2 | 2/2005 | Tsironis | |
| 6,980,064 B1 | 12/2005 | Boulerne | |
| 7,053,628 B1* | 5/2006 | Tsironis | G01R 27/32 324/637 |
| 8,098,112 B2 | 1/2012 | Simpson | |
| 9,252,738 B1 | 2/2016 | Tsironis | |
| 9,625,556 B1 | 4/2017 | Tsironis | |
| 11,621,468 B1* | 4/2023 | Tsironis | H03H 7/38 333/33 |

OTHER PUBLICATIONS

"Load Pull" [online] Wikipedia, [Retrieved on Aug. 24, 2017]. Retrieved from Internet <URL: /en.wikipedia.org/wiki/Load_pull>.
"Computer Controlled Microwave Tuner, CCMT", Product Note 41, Focus Microwaves Inc. 1998, pp. 2-4.

* cited by examiner

*Primary Examiner* — Amy He (57) ABSTRACT

Adjustable combination tuning probes for slide screw load pull tuners allow larger frequency coverage Fmax/Fmin and higher VSWR beyond the capacity of existing tuning probes. This is done by combining two equally or unequally long tuning slugs, a fixed slug and a mobile slug into a combination probe assembly being mounted in the same mobile tuner carriage. The mobile slug slides on a top bar and is lockable at adjustable distance from the fixed slug. The distance (gap) is adjustable by engaging and moving the assembly against the prongs of forks attached to the slabline at the test or idle ports.

9 Claims, 10 Drawing Sheets

LOAD PULL TUNING PROBE WITH ADJUSTABLE NOTCH

PRIORITY CLAIM

Not Applicable

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4
3. Tsironis, C. U.S. Pat. No. 6,850,076, "Microwave tuners for wideband high reflection applications".
4. Boulerne, P. U.S. Pat. No. 6,980,064, "Slide-screw Tuner with Single Corrugated Slug".
5. Simpson, G. U.S. Pat. No. 8,098,112, "Impedance Tuner Systems and Probes".
6. Tsironis, C. U.S. Pat. No. 9,252,738, "Wideband Tuning Probes for Impedance Tuners and Method".
7. Tsironis, C. U.S. Pat. No. 9,625,556, "Method for Calibration and Tuning with Impedance Tuners".

BACKGROUND OF THE INVENTION

This invention relates to testing microwave transistors (DUT) in the high frequency (typically GHz range) domain using Load Pull (see ref. 1). Load Pull is a measurement method whereby the load impedance presented to the DUT at a given frequency is changed systematically and the DUT performance is registered, with the objective to find an optimum embedding (matching) network for obtaining the design objectives, which may be maximum gain, power, efficiency, linearity or else.

PRIOR ART

Figure 1:
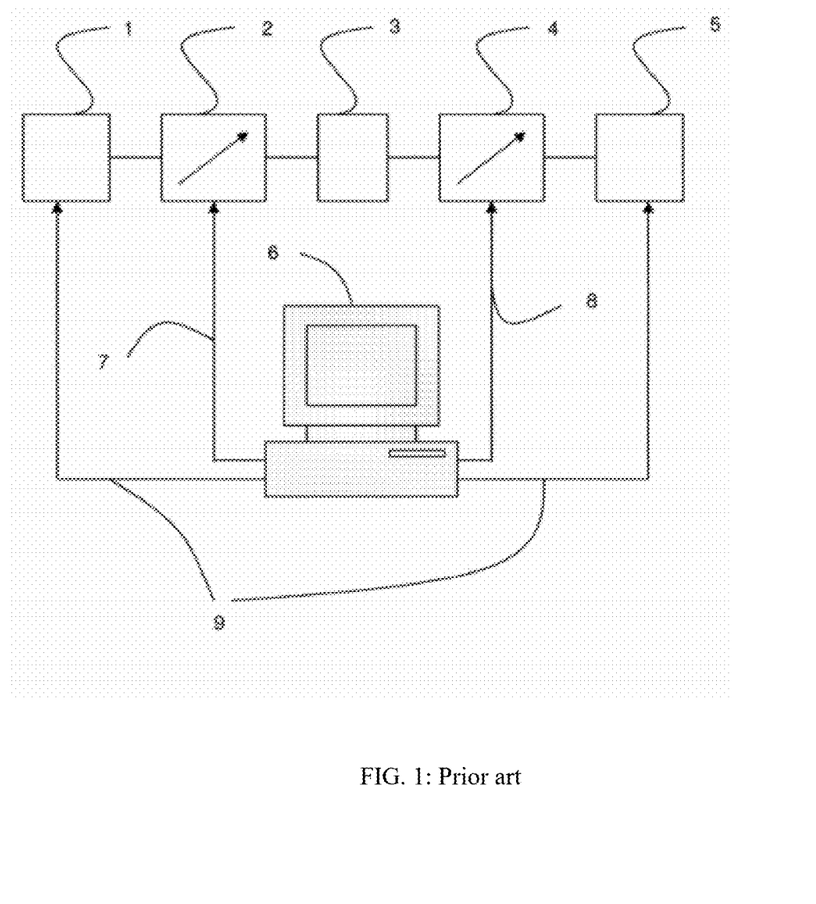
FIG. 1 depicts prior art, a typical scalar (measuring amplitude only) load pull test system using pre-calibrated passive tuners.

The popular load pull method for testing and characterizing medium to high-power microwave and Millimeter-Wave transistors (DUT, device under test) is called "load-pull" and uses appropriate test setups (FIG. 1), see ref. 1. Low noise transistors are tested using "source-pull". Load or source pull use impedance tuners 2, 4 (see ref. 2) and other test equipment, such as signal or noise sources 1, test fixtures housing the DUT 3, and power meters or low noise receivers 5, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner, under which the DUT is tested (see ref. 1); impedance tuners allow determining the optimum impedance conditions of embedding networks for designing amplifiers and other microwave components for specific performance targets, such as noise parameters, gain, efficiency, intermodulation etc. For devices in chip-form, tested preferably on-wafer (see ref. 5), the insertion loss between the DUT and the tuner reduces the effective reflection factor $I_{LOAD}$ at the DUT reference plane. The only method to increase the reflection factor in a passive system is increasing the reflection factor of the tuner. Since the tuning probe 34 is capacitively coupled with the center conductor 33, this means increasing the maximum controllable capacitance by increasing the surface between the probes and the center conductor, which is possible, while avoiding a short circuit, by increasing its horizontal length 37 or use a second tuning probe in a pre-matching configuration (see ref. 3). In that case the reflection vector of the first probe (slug) is added to the second probe and, depending on the relative phase between the vectors, can be added or subtracted. Various types of static combination tuning probes, including one or more slugs, have been reported before (see ref. 3, 4, 5 and 6); however, none includes remotely controllable dynamic configuration of the tuning probe assembly and, in addition and in particular, not involving additional manual or remote electro-mechanical control, beyond the original single horizontal and single vertical axis.

BRIEF DESCRIPTION OF THE INVENTION

The objective of this invention is a tuning probe system for slide screw impedance tuners, which (a) allow flexible maximum to minimum frequency coverage, (b) can simply replace existing tuning probes in existing tuners without additional remote-control and (c) use the core of existing tuner calibration and data processing routines. An added bonus is a considerably higher tuning dynamic range (maximum VSWR or GAMMA), beyond the capacity of existing tuning probes, implemented with minimum cost and without requirement for additional external mechanical intervention. This is done by creating a tuning probe system with one fixed and one mobile slug sliding aligned with the fixed slug and allowing a dynamic frequency shifting "synchronized" pre-matching mode (see ref. 3). Here, horizontal 37 means parallel to the slotted tuner airline (slabline) 31 and vertical 36 means perpendicular to it. To avoid spurious resonance phenomena and ensure continuous frequency coverage the equally or unequally long tuning slugs are somehow linked to each-other 46 and guided appropriately 47. This is done using a proposed (one of many possible) mechanical arrangement (embodiments) allowing smooth, un-inhibited and continuous movement of the metallic bodies.

DETAILED DESCRIPTION OF THE DRAWINGS

The invention and its mode of operation will be better understood from the following detailed description when read with the appended drawings in which:

FIG. 6A through 6B depict the procedure of controlling the gap between slugs.

DETAILED DESCRIPTION OF THE INVENTION

Figure 2:
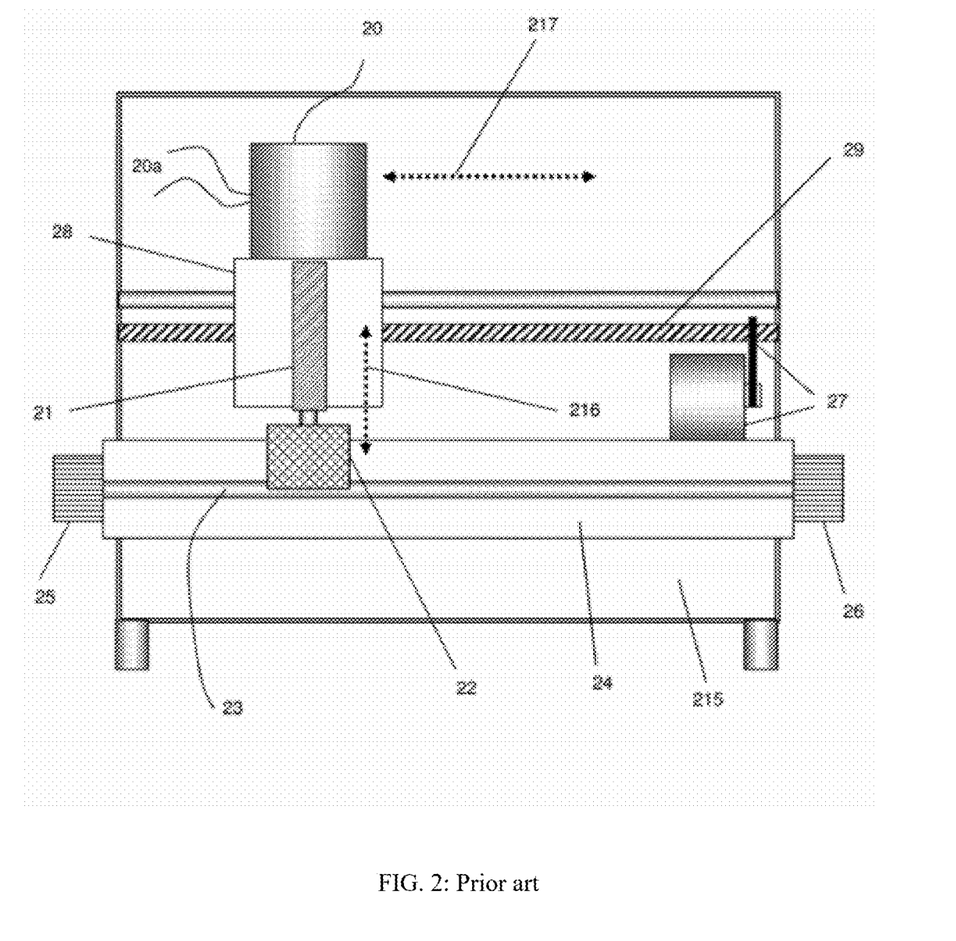
FIG. 2 depicts prior art, a schematic front view of a passive slide screw load pull tuner.

A typical slide screw tuner is shown in FIG. 2: it includes a slotted airline, mostly a slabline 24, with a typically cylindrical center conductor 23, a test port 25 and an idle port 26. Inside the tuner housing 215 there is a mobile carriage 28 traveling along 217 the slabline, driven by a screw 29 and a motor and gear 27; in the carriage 28, there is a vertical axis mechanism 21 moving an, attached to it, tuning probe (slug) 22 between and along the walls of the slabline, towards and away 216 from the center conductor 23 with which it is capacitively coupled. The vertical axis 21 and the slug 22 are controlled by a second motor 20 which is also remotely controlled 20a.

Figure 3:
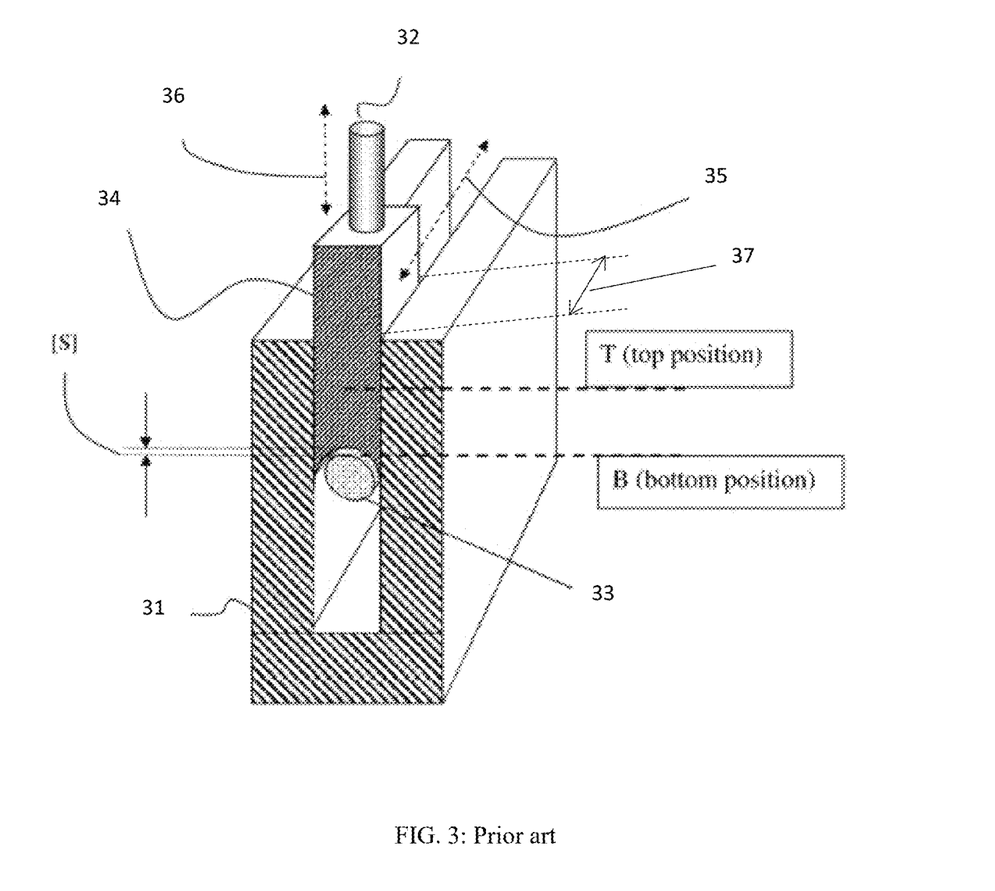
FIG. 3 depicts prior art, a perspective view of a metallic reflective tuning probe (slug).

The tuning probe (slug) is shown in FIG. 3: it includes a square metallic body 34 and has a concave bottom matching the shape (diameter) of the center conductor 33 of the slabline 31 and a holding pin 32 to be attached to the vertical axis mechanism 21. The slug moves vertically 36 and horizontally 35 controlled by the axis 21 and the carriage 28. Vertically, it moves between a top position T and a bottom position B leaving a small gap [S] to avoid a short circuit. Length 37 of the parallelepiped slug is defined along the axis of the slabline.

Figure 4:
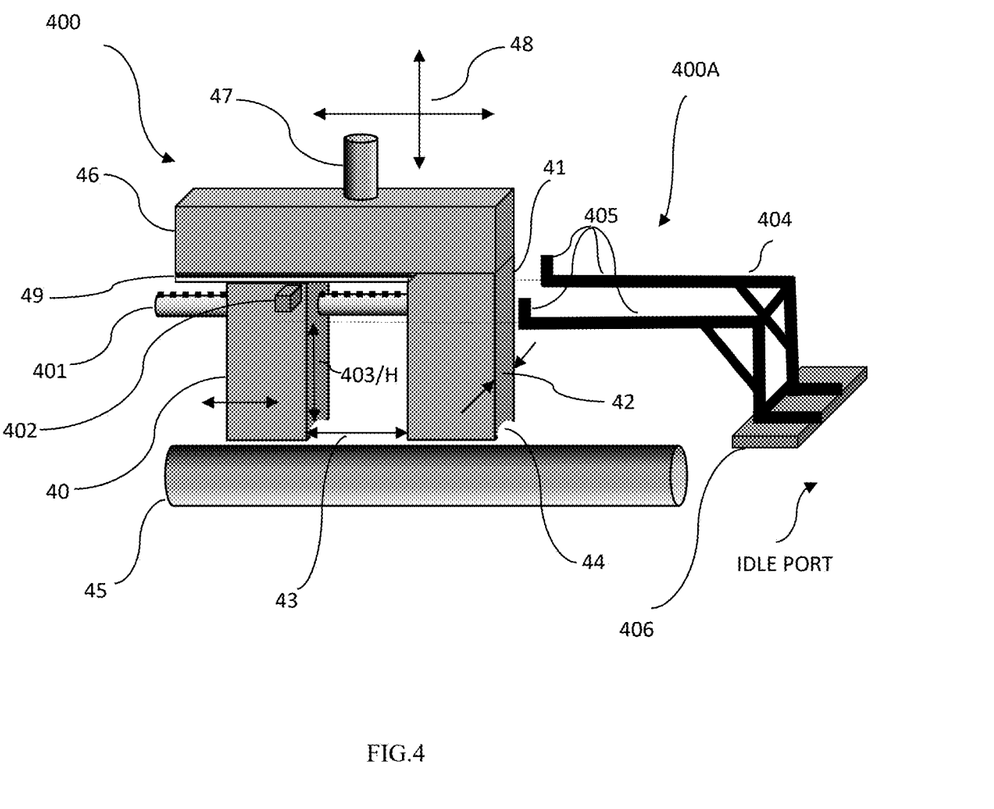
FIG. 4 depicts the tuning probe system and control: it includes the linked slugs and the movement limiting fork.

FIG. 4 shows the dual-slug tuning probe system: it includes the tuning probe assembly 400 and the hardware needed to control its configuration 400A: the tuning probe assembly comprises two tuning slugs 40 and 41 having the same thickness 42 and a distance (gap) between them 43; the slugs have a concave bottom 44, which matches the diameter of the central conductor 45; the two slugs are held together using the horizontal bar 46, which is attached to the vertical axis mechanism of the tuner using the dowel pin 47; the assembly can be moved remotely horizontally and vertically 48; the fixed slug 41 is attached permanently to the bar 46 and the mobile slug 40 is linked to the bar 46 using a slider 49, that allows to the slug 40 to move horizontally and change the gap 43. The mobile slug 40 is traversed by a guiding, supporting, and aligning rod 401, which is attached to the fixed slug 41 and has ratchets on the top surface for locking the position of slug 40 versus slug 41. The mobile slug 40 has also, on its front and back side, a protruding ridge 402, which is placed at a specific height 403(H) relative to the bottom of the slug 40 to allow engaging and dis-engaging with the spiked prongs 405 of the fork 404 by properly moving the assembly 400 vertically and horizontally.

The tuning system also includes the means 400A, including items 404 and 405, to control, remotely, the position of the moving slug 40 relative to the fixed slug 41, which completes the tuning probe system. These include the fork 404, with two prongs with end spikes 405, attached 406 to the slabline or to the tuner housing at the idle port. The height of the fork prongs is adjusted align with the protruding ridge 402 to be able either to hit it frontal or engage (hook on to . . . ) and pull it, and the opening of the prongs to be slightly larger than the thickness 42 of the slugs, to be able, to push or engage and pull, smoothly and symmetrically, the protruding ridges when the probe assembly moves towards or away from the idle port.

Figure 5:
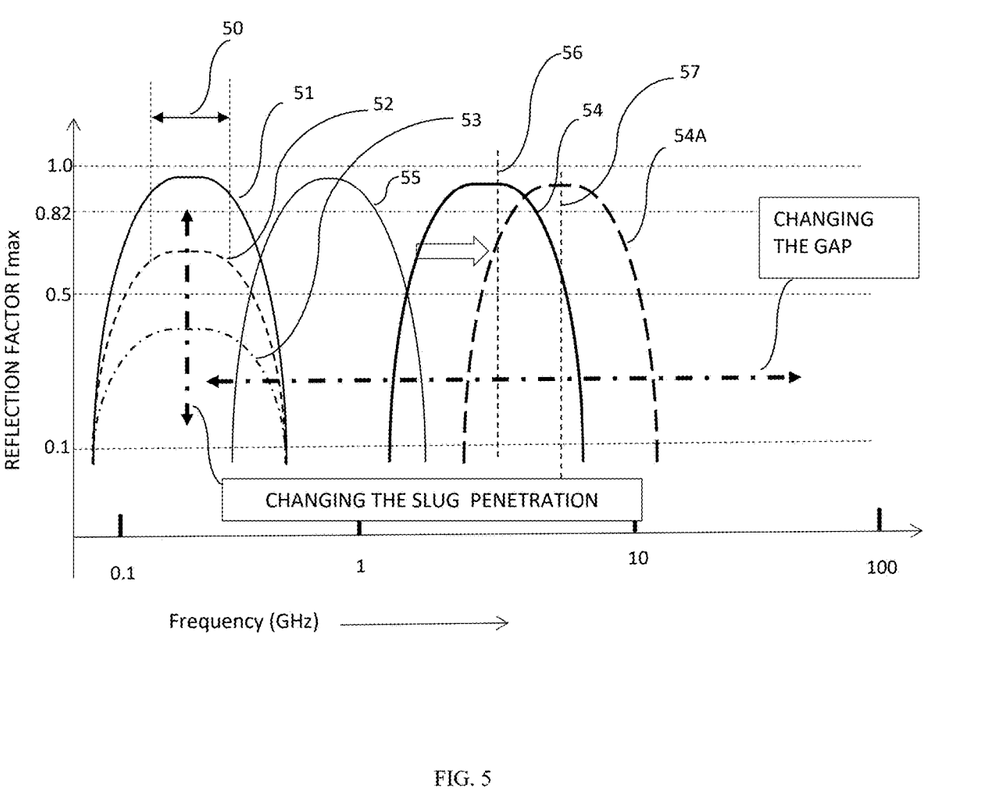
FIG. 5 depicts a typical frequency response of the tuning probe system as a function of the gap (distance) between the fixed slug and the mobile slug.

The creation of reflection factors of the tuning probe assembly of FIG. 4 is demonstrated using two diagrams: FIG. 5 shows the frequency response as a function of the value of the gap 43 and FIG. 9 shows the vectorial synthesis of the reflection factor: the diagram of FIG. 5 demonstrates both the importance and flexibility of the tuning probe system: by adjusting the gap between the fixed and mobile slugs, we obtain reflection factor responses 51, 54, 55 covering individually a medium bandwidth 50, but overall a high frequency range, spread beyond several octaves (Fmax/Fmin>20); at the same time the tuning system, once the gap is locked, behaves benignly like a single slug, moving the reflection from low values 53 in continuous steps 52 to the highest level 51; this ensures full compatibility with existing interpolation and tuning algorithms used in this kind of single probe tuner (see ref. 7).

Figure 9:
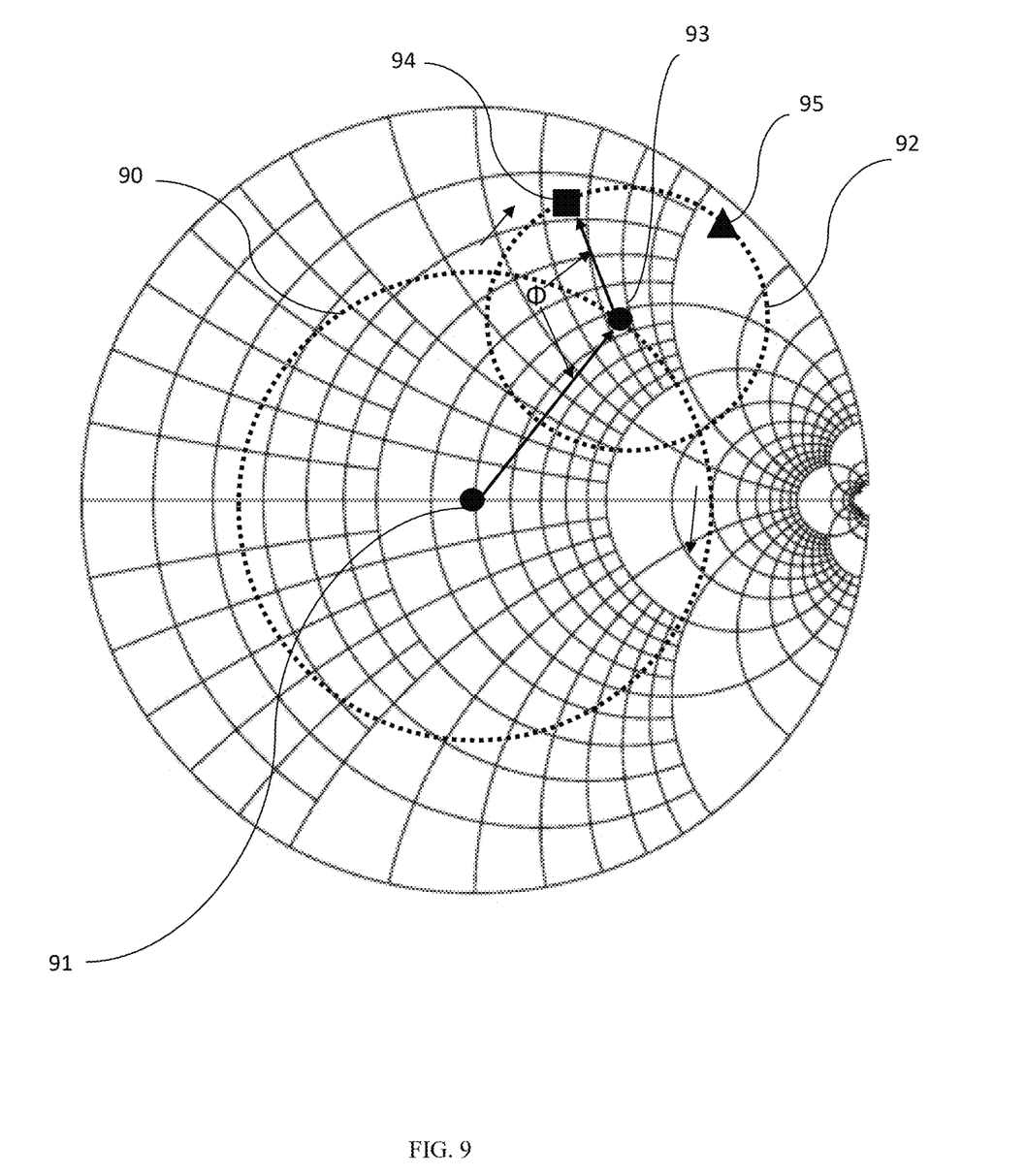
FIG. 9 depicts the trajectory of reflection factor of each slug as a function of frequency resulting to one of the bell contours in FIG. 5.

FIG. 9 demonstrates how the reflection factor creation mechanism of the tuning assembly works for a fixed gap 43: the first slug (mobile or fixed, depending on the orientation and which port is the test port) creates a trace 90 as a function of frequency around the center of the Smith chart 91; then, depending on the exact size of the gap 43, and the frequency, the second slug creates a second trace 92, which rotates around a center 93 on trace 90 creating a total reflection 94, which, however, is not the maximum possible, because the vectors [91-93] and [93-94] have an angle @ among them which changes with the frequency and the distance (gap) and are, in the present case, not aligned; if they were aligned, which is a matter of the gap 43 size and the exact frequency, then we would get the maximum reflection 95, which is always possible, by adjusting the gap for a specific frequency, and is a built-in advantage of this solution.

Figure 6A:
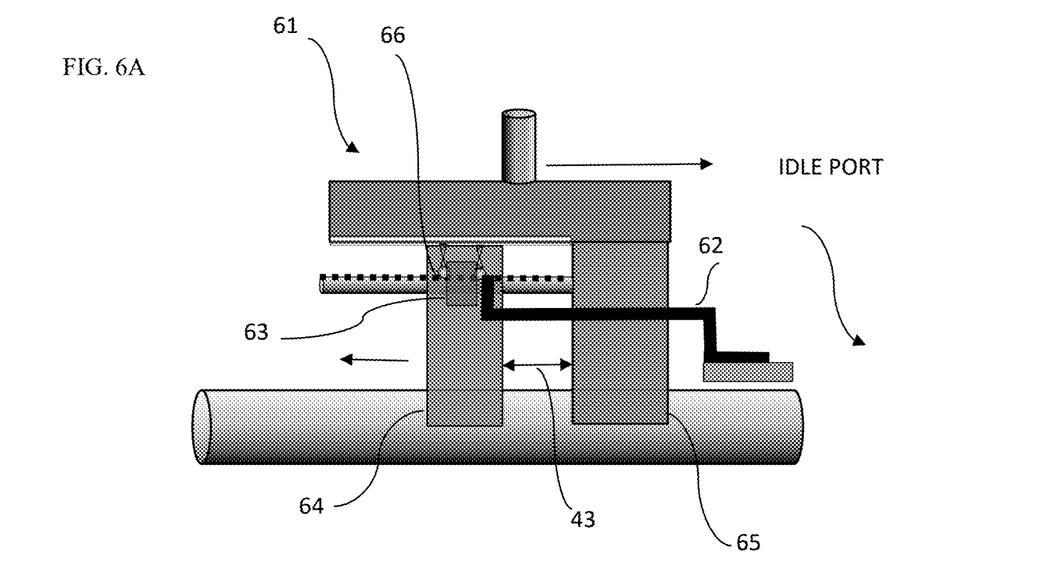
FIG. 6A depicts the process of increasing the gap by pushing the ridge against the prongs.
Figure 6B:
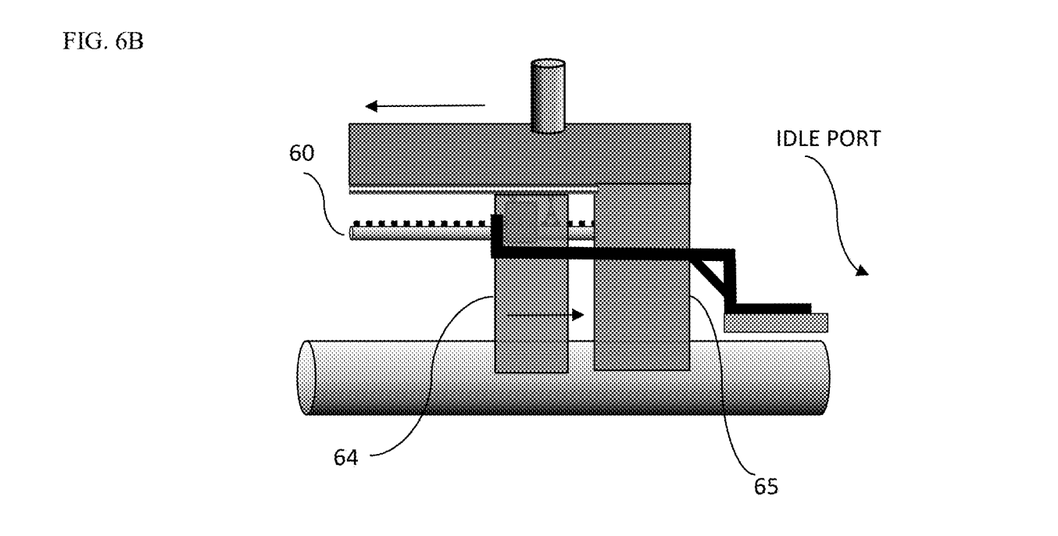
FIG. 6B depicts the process of decreasing the gap by engaging the ridge by the prong spikes and pulling towards the fixed slug.
Figure 10:
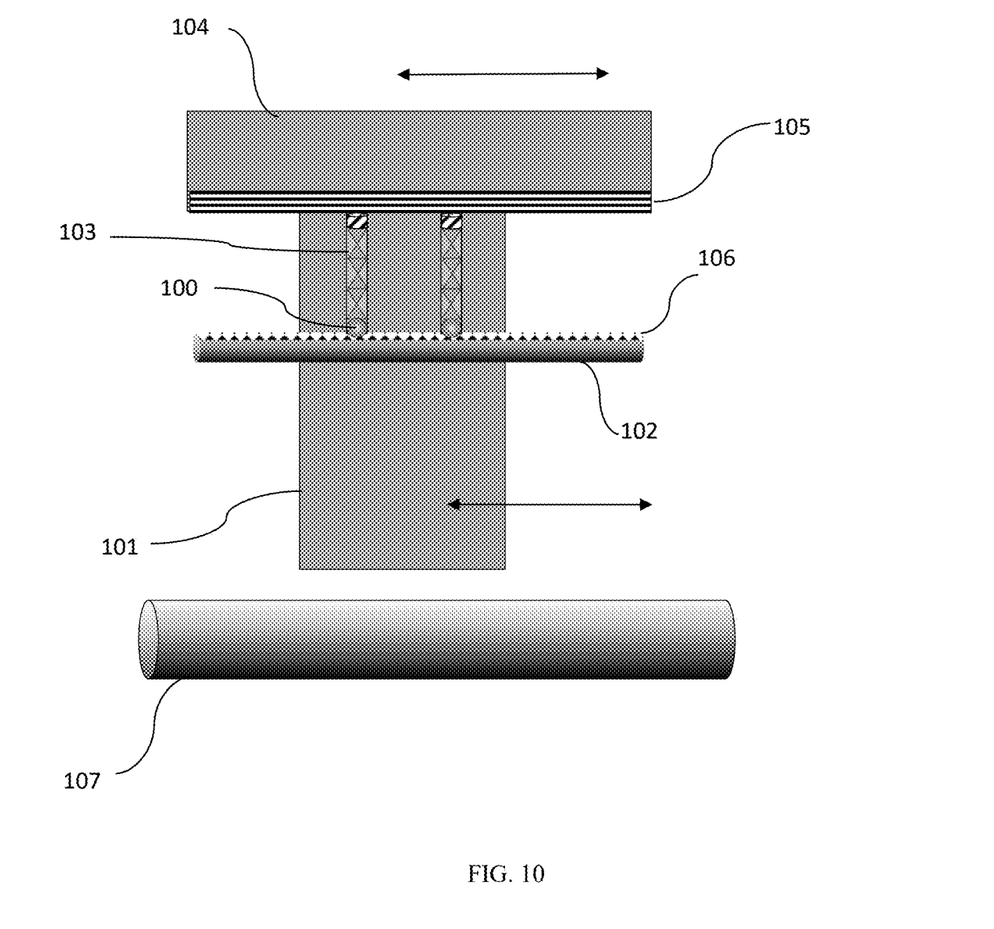
FIG. 10 depicts an embodiment of locking mechanism of the mobile slug against the fixed slug using the rod with top ratchets and the spring-loaded steel balls.

The two situations where the tuning probe system is being configured, are shown in FIGS. 6A and 6B; in FIG. 6A the carriage 28 (FIG. 2) pushes the tuning probe assembly 61, guided by the teethed rod 60, towards the idle port and the prongs of the fork 62 contact the protruding ridges 63 and push the mobile slug 64 away from the fixed slug 65 increasing this way the gap 43; the continuous movement of the assembly 61 along the top guide 104 on a slider 105 causes the mobile slug 64/101 to lock at discrete intervals (gaps) versus the fixed slug 65, at constant distance from the center conductor 107, because the spring loaded 103 steel balls 66 (also shown as item 100 in FIG. 10) can only lock into the ratchets 106 of the rod 401/102 at discrete positions. The mechanism works symmetrically to decrease the gap when the prongs 62 engage the ridge 63 and pull the mobile slug 64 towards the fixed slug 65 as shown in FIG. 6B.

Figure 7:
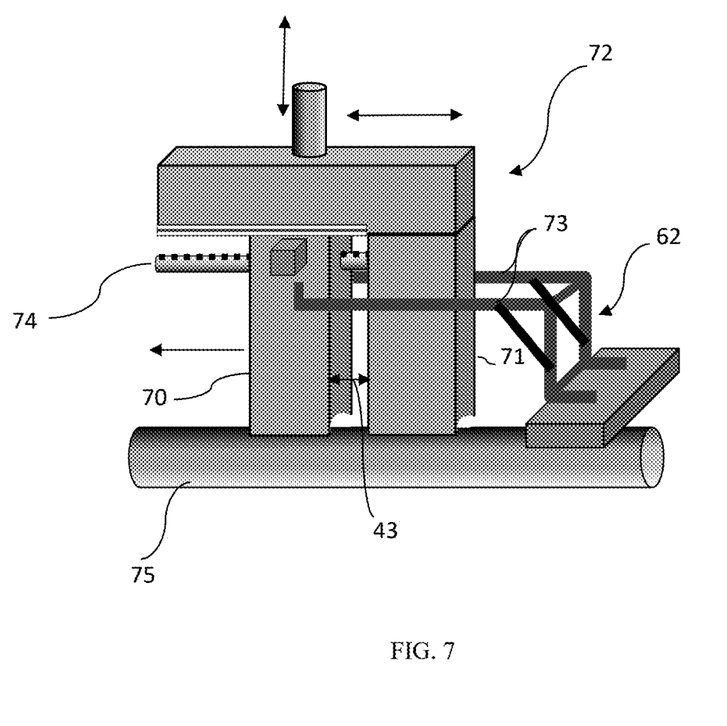
FIG. 7 depicts a perspective view of the tuning probe assembly and the interaction with the controlling fork, together building the tuning probe system.

A better view of the entire tuning probe system in the process of widening the gap 43 is shown in FIG. 7: the two slugs 70, 71 are always at the same distance from the center conductor 75 and act as a single notch slug, albeit with configurable distance (gap) between them. This tuning probe assembly 72 can replace the slug 22 in an existing tuner and, by adding the permanent forks 62, it becomes configurable without any extra remotely controlled gear or manual intervention. To modify the configuration (i.e., the gap 43), the tuning probe assembly must simply be lowered or lifted to a certain distance from the center conductor, calculated in a way for the protruding ridge to either face or engage the fork's 62 prongs 73 and then move towards or away from the idle port. The best movement balance and stability of the mobile slug is reached when the ridges on both sides of the mobile slug and the prongs are at roughly the same height as the ratcheted rod 74.

Figure 8:
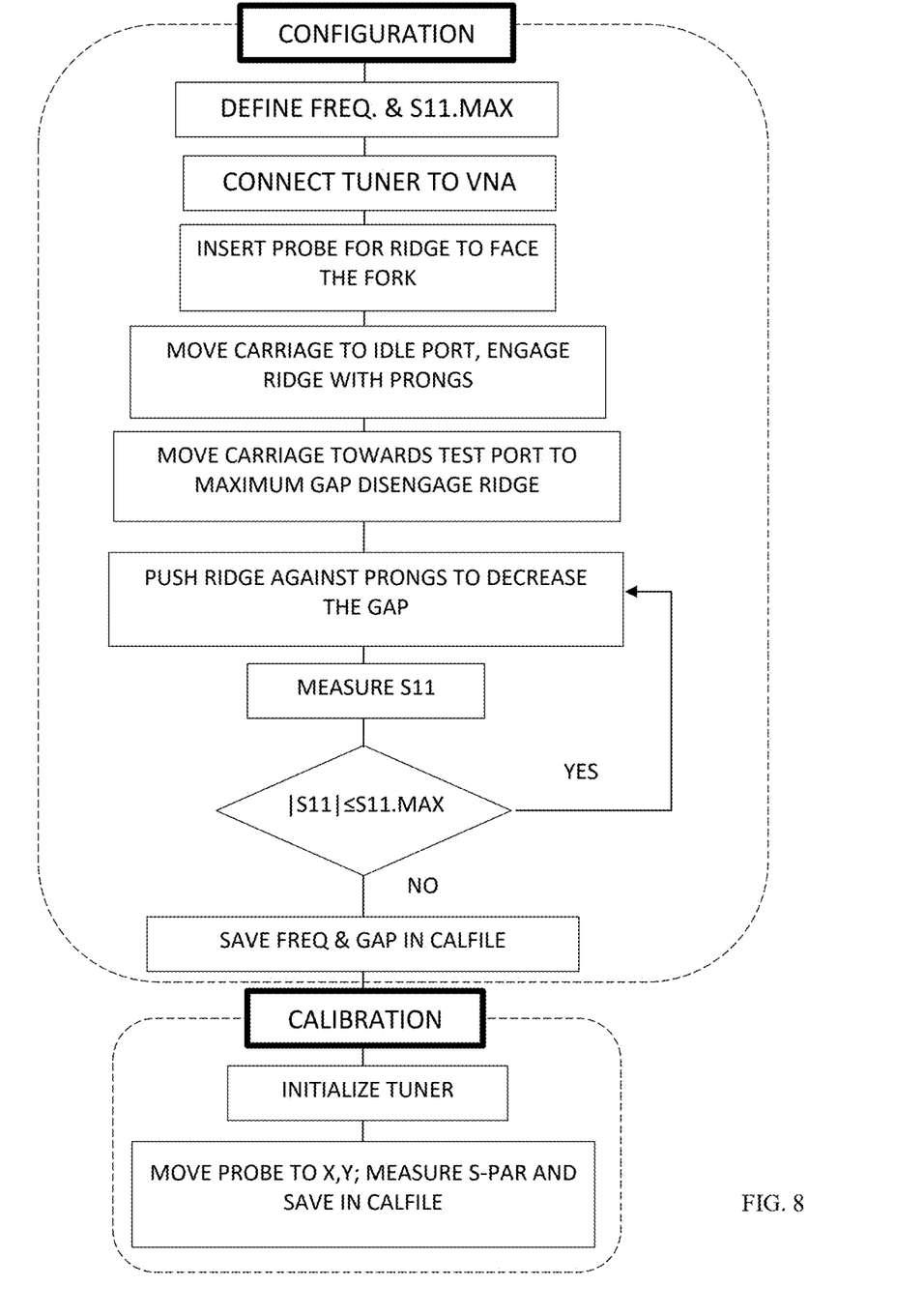
FIG. 8 depicts the flowchart of the tuner configuration and calibration.

The tuner including the tuning probe system can be calibrated as hitherto tuners (see ref. 7) with an additional configuration step as shown in the flowchart of FIG. 8, needed only if the requested frequency 57 is outside the actual response 54 of the slug setting. If the requested frequency 56 is inside the response of the tuning probe assembly, then the configuration step can be bypassed. Per flowchart of FIG. 8, the configuration step consists in modifying the gap 43 between the mobile and fixed slug in a move-measure loop, until the simultaneously measured reflection factor reaches a preset maximum for the actual vertical position of the tuning assembly.

To start with, the tuner is connected to a pre-calibrated vector network analyzer (VNA), which measures s-parameters, in particular at the test port (S11 or S22 depending on the definition); then the two slugs are joined (gap=0) by engaging the ridge 401 with the spikes of the fork 404 (FIG. 6B) and pulling the carriage 28 and the attached to it tuning probe assembly 400 away from the idle port. Then a move-measure loop starts, by which the ridge 63 is disengaged from the fork 62 and directed for the ridge to hit frontal on the prongs of the fork, and the carriage (holding the assembly 61) is moved towards the idle port increasing this way the gap 43, measuring S11 and finishing if a requested maximum value S11.max is reached. In terms of frequency response in FIG. 5, this operation shifts the trace 54 to the right (higher frequencies, 54A) until the target frequency 57 moves to the center of the 54A-bell response. Once a satisfactory gap 43 is determined, then the tuner is initialized by moving the tuning probe assembly to a horizontal and vertical zero, determined using a set of zero limitation switches and a normal, prior art tuner calibration is executed, setting the tuning probe assembly to a multitude of horizontal and vertical positions, best selected to create reflection factors uniformly covering the Smith chart, and s-parameters of the tuner are measured and saved, as outlined in detail in ref. 7.

Expanding the concept to a double carriage and slug (harmonic) tuner is possible by adding a second mobile carriage with the same tuning probe assembly and a second control fork at the opposite end of the slabline (the test port side) employing the correspondingly modified control and configuration procedure and the multi-probe calibration method as equally disclosed in ref. 7.

The present invention discloses a tuning probe system for load pull tuners, having an assembly including two vertically and horizontally synchronous movable slugs, and tools and method allowing to change the horizontal distance between them. The slugs are mounted and controlled such as to create a synchronized pre-matching configuration (see ref. 3) however being remotely adjustable without additional electro-mechanical control or manual intervention. Obvious alternative embodiments shall not impede the originality of the idea.

What is claimed is:

1. A tuning probe system for slide screw load pull tuner, wherein
   the slide screw load pull tuner comprises a slabline, having two sidewalls, a center conductor, a test port, a controlling idle port and at least one remotely controlled mobile carriage, sliding horizontally along the slabline, and including one remotely controlled vertical axis mechanism holding a configurable tuning probe assembly;
   and wherein
   the tuning probe system comprises:
   a) the configurable tuning probe assembly which is attached to the vertical axis mechanism using a handle, is insertable between the sidewalls of the slabline and includes two metallic slugs, a fixed slug, and a mobile slug, linked together by a horizontal top bar,
   b) means for remotely and automated controlling a distance (gap) between the mobile slug and the fixed slug of the configurable tuning probe assembly,
   and wherein
   the slugs have a square body with a length along the slabline and a thickness perpendicular to the slabline, a front and a back, and a bottom surface matching the center conductor, and slide-fit between the sidewalls of the slabline;
   and wherein
   the fixed slug is permanently attached to the top bar, and the mobile slug is linked with the top bar using a horizontal slider and with the fixed slug using a horizontal ratchet guide, which is attached to the fixed slug and traverses the mobile slug along the slabline;
   and wherein
   the mobile slug has on its front and back a protruding ridge (stud), it slides along the top bar and is lockable at various horizontal distances (gaps) from the fixed slug;
   and wherein
   the means for remotely and automated controlling the distance (gap) between the mobile slug and the fixed slug comprise a fork having two prongs and being attached to the slabline close to the controlling idle port and an automated control procedure.

2. The tuning probe system for slide screw load pull tuner of claim 1,
   wherein
   the two prongs of the fork run parallel to the slabline, have an opening between them as wide as the slugs and each prong has a vertical hook at the end capable to catch the ridge (stud).

3. The tuning probe system of claim 2, wherein the automated control procedure for modifying the distance (gap) between the mobile slug and the fixed slug comprises:
   to reduce the gap:
   a) the configurable tuning probe assembly is moved towards the controlling idle port and directed for the prongs to hook on to the ridge and hold back the mobile slug;
   b) the carriage is moved away from the controlling idle port to reduce the gap;
   c) the configurable tuning probe assembly is directed for the ridge to un-hook from the prongs;
   to increase the gap:
   d) the configurable tuning probe assembly is moved towards the controlling idle port and directed for the prongs to make frontal contact with the ridge;
   e) the carriage is moved towards the controlling idle port to increase the gap;
   f) the carriage is moved away from the controlling idle port.

4. The tuning probe system of claim 1, further comprising a locking mechanism for the mobile slug of the tuning probe system,
   wherein the top bar and the mobile slug slide on each-other and the mobile slug is guided by a traversing rod with the ratchets, and wherein the mobile slug has at least two protruding vertical spring-loaded steel balls that lock into the ratchets of the traversing rod.

5. The tuning probe system of claim 4, wherein the locked slugs and the top bar form an assembly maintaining a fixed distance between the slugs while moving vertically and horizontally between the sidewalls of the slabline.

6. The tuning probe system of claim 1, wherein the slugs have various horizontal lengths.

7. The tuning probe system of claim 1, wherein the slugs have the same horizontal length.

8. The tuning probe system of claim 1, wherein the vertical axis mechanism and the mobile carriage are remotely controlled using stepper motors and gear.

9. A calibration method for the slide screw load pull tuner of the tuning probe system of claim 1 comprising two steps:

a) a configuration step determining the best distance (gap) between the slugs for a target frequency, and b) a calibration step measuring and saving tuner s-parameters for a multitude of tuning probe settings;

wherein a) the configuration step comprises:

a1) enter the target frequency;

a2) connect the tuner to a pre-calibrated vector network analyzer (VNA);

a3) move the carriage towards the controlling idle port, arrange for the prongs of the fork to engage (hook on to) the ridge (stud), insert the tuning probe assembly close to the center conductor and pull the carriage away from the idle port to minimize the gap;

a4) dis-engage (unhook) the ridge from the prongs and move the carriage away from the controlling idle port;

a5) direct the tuning probe assembly for the ridge to make frontal contact with the prongs;

a6) in a move-measure loop:

move the carriage further towards the controlling idle port and increase gradually the gap (distance) between the mobile slug and the fixed slug by pushing the ridge (stud) of the mobile slug against the prongs of the fork; measure a reflection factor S11 at the test port, halt when |S11| reaches a maximum value and save the frequency and the gap (distance) between the slugs in a tuner calibration file;

a7) initialize the tuner by returning the tuning probe assembly to a horizontal zero limit close to the test port and to a vertical zero limit by withdrawing the tuning probe assembly from the slabline;

b) the calibration step comprises a move-measure loop, wherein, the tuning probe assembly is set to a multitude of horizontal and vertical positions, s-parameters are measured and saved together with the tuning probe assembly horizontal and vertical positions in the tuner calibration file.

* * * * *